(12) United States Patent
Lambrache

(10) Patent No.: US 7,245,555 B2
(45) Date of Patent: Jul. 17, 2007

(54) AUTOMATIC ADDRESS TRANSITION DETECTION (ATD) CONTROL FOR REDUCTION OF SENSE AMPLIFIER POWER CONSUMPTION

(75) Inventor: Emil Lambrache, Campbell, CA (US)

(73) Assignee: Atmel Corporation, San Jose, CA (US)

( * ) Notice: Subject to any disclaimer, the term of this patent is extended or adjusted under 35 U.S.C. 154(b) by 37 days.

(21) Appl. No.: 11/301,040

(22) Filed: Dec. 12, 2005

(65) Prior Publication Data

US 2007/0133340 A1    Jun. 14, 2007

(51) Int. Cl.
*G11C 8/00* (2006.01)
(52) U.S. Cl. .............. 365/233.5; 365/233; 365/194
(58) Field of Classification Search ........... 365/233.5, 365/233, 194, 205, 207
See application file for complete search history.

(56) References Cited

U.S. PATENT DOCUMENTS

| 5,247,213 | A | 9/1993 | Trinh et al. ............... 307/465 |
| 5,371,709 | A | 12/1994 | Fisher et al. ............... 365/226 |
| 5,493,533 | A | 2/1996 | Lambrache ............... 365/210 |
| 5,682,353 | A | 10/1997 | Eitan et al. ............... 365/233 |
| 5,740,112 | A | 4/1998 | Tanaka et al. ......... 365/189.01 |
| 7,002,857 | B2 * | 2/2006 | Kang ..................... 365/194 |

* cited by examiner

*Primary Examiner*—David Lam
(74) *Attorney, Agent, or Firm*—Schneck & Schneck; Thomas Schneck

(57) ABSTRACT

An automatic ATD control circuit operates with a first delay circuit accepting a system clock pulse as an input and producing a delayed version of the system clock pulse as an output. The delay to the system clock is performed to allow a frequency comparison in a later part of the circuit. An edge detection circuit operates when the delayed system clock is received and senses an edge of the delayed system clock pulse. A pulse output from the edge detection circuit feeds into a second delay circuit; the second delay circuit produces an output pulse where a period of the pulse is determined by delay characteristics of the sense amplifier and is thus independent of system clock frequency. The pulse is compared to the system clock frequency. If the system clock frequency is above a determined frequency, the automatic ATD control circuit is disabled.

24 Claims, 8 Drawing Sheets

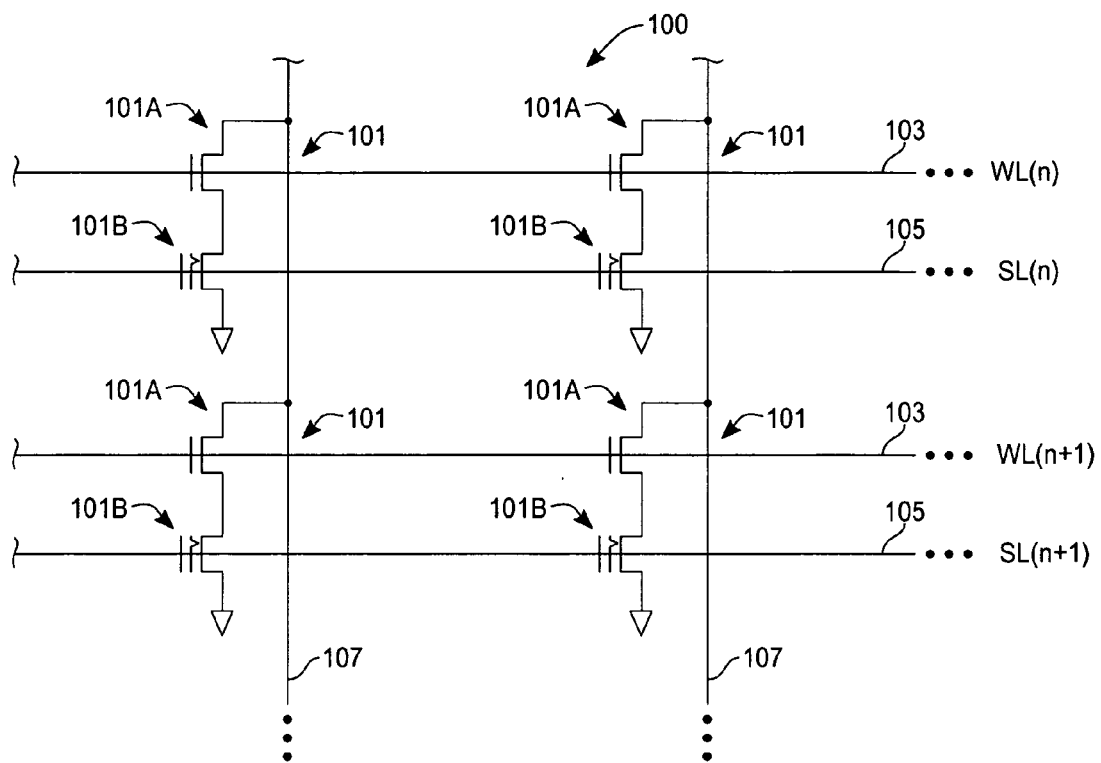
*Fig._1 (Prior Art)*
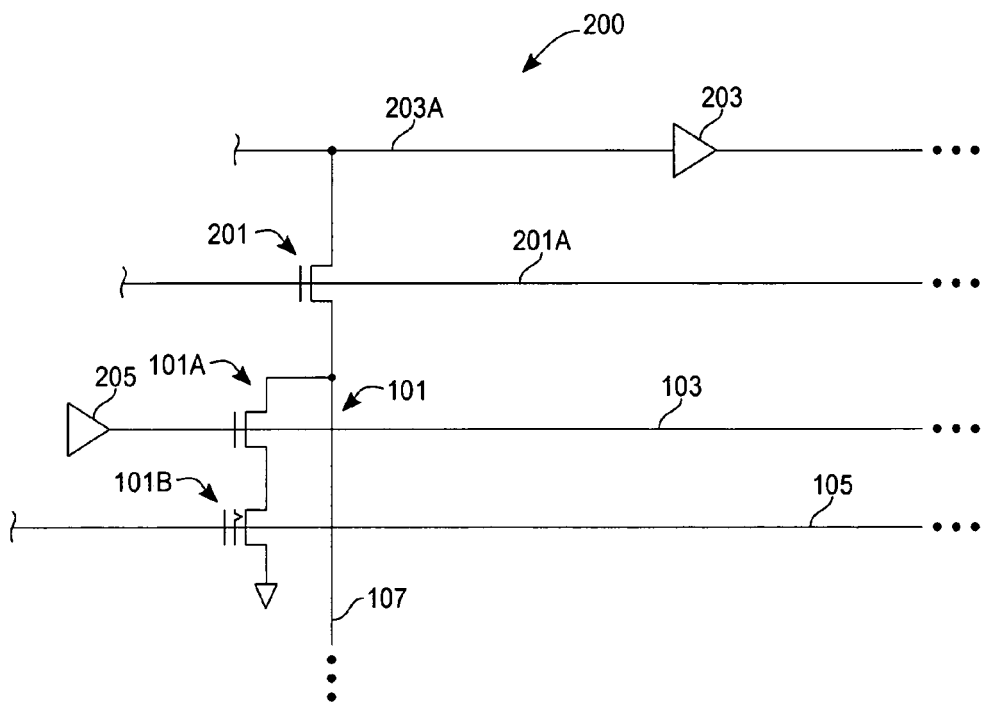
*Fig._2 (Prior Art)*

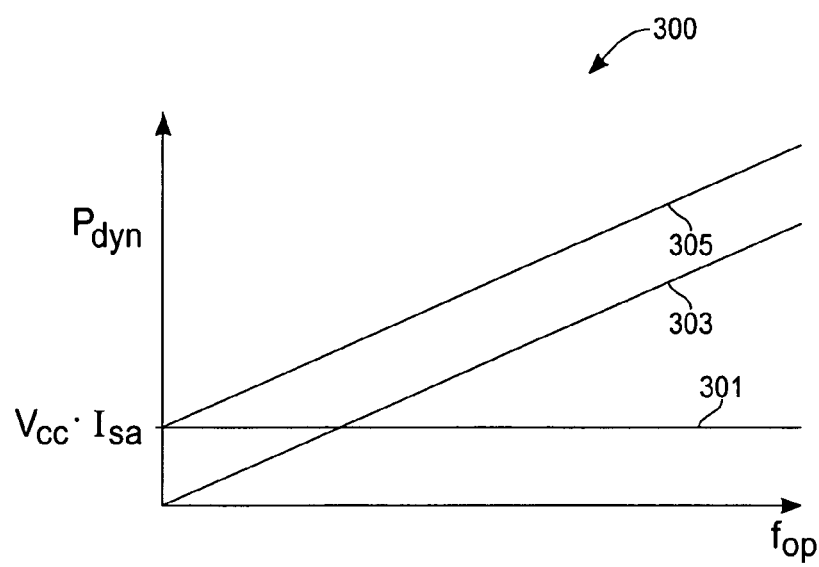
Fig._3
(Prior Art)
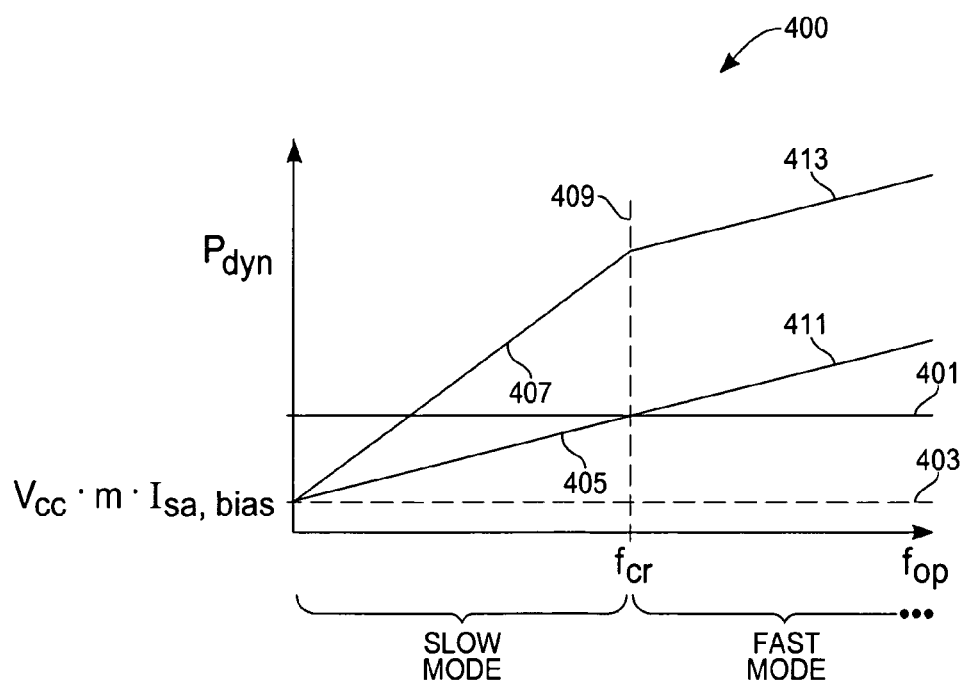
Fig._4

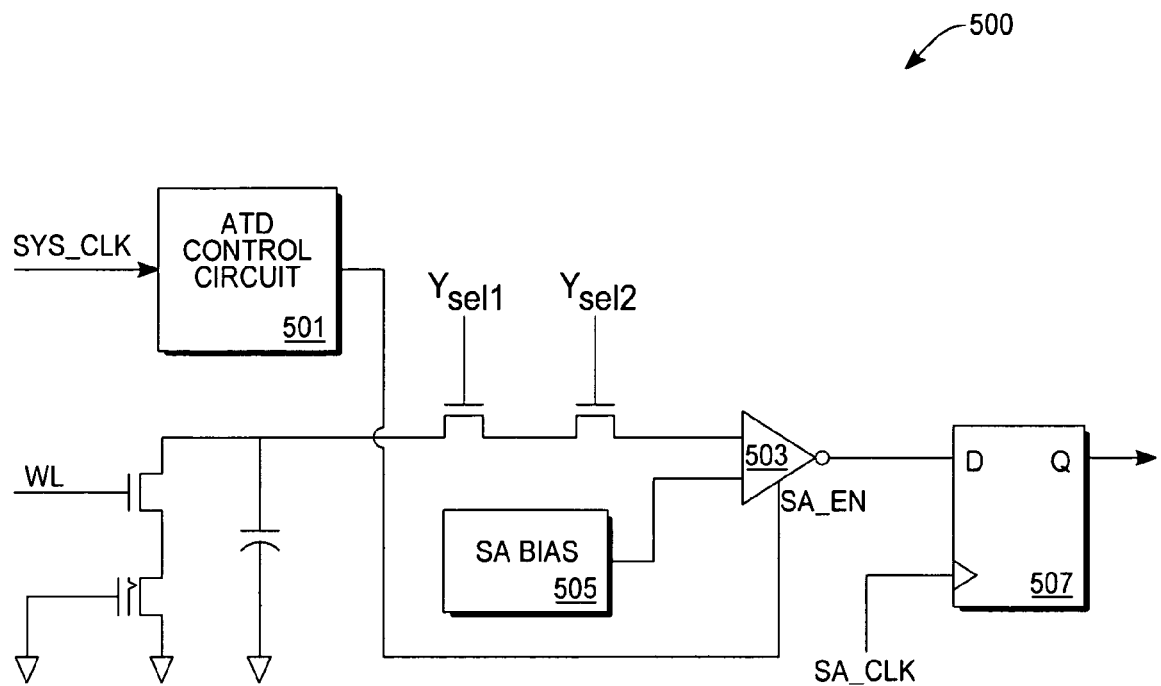
Fig._ 5A

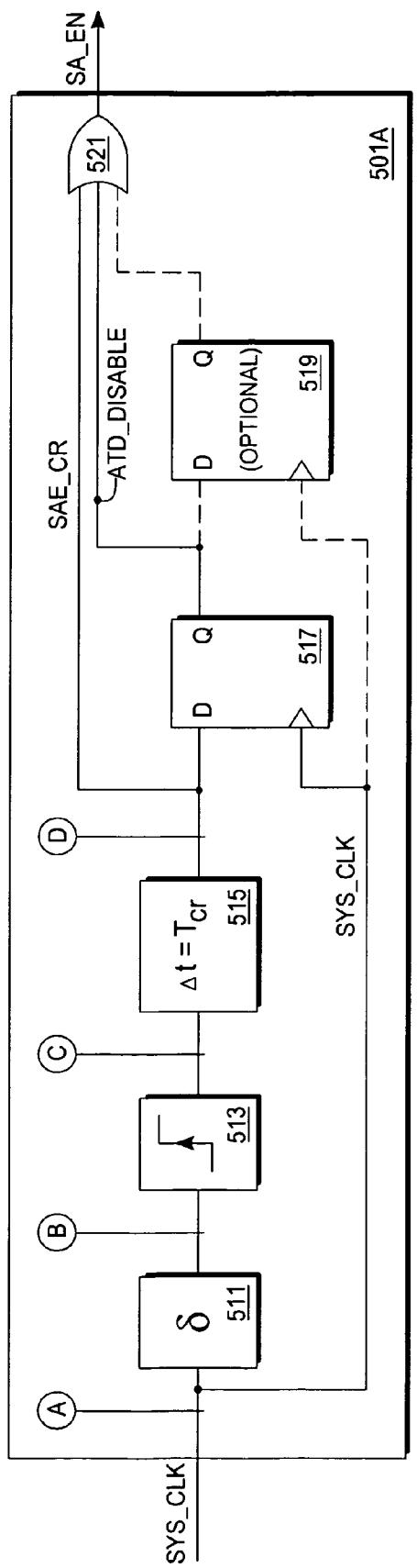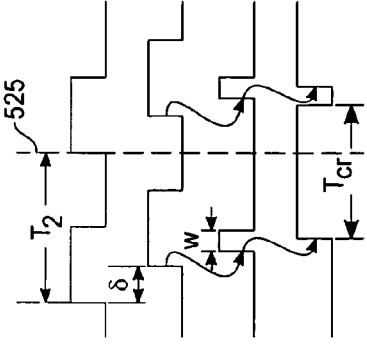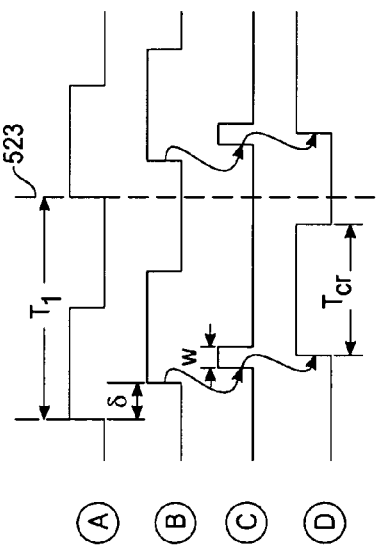
Fig. _ 5B

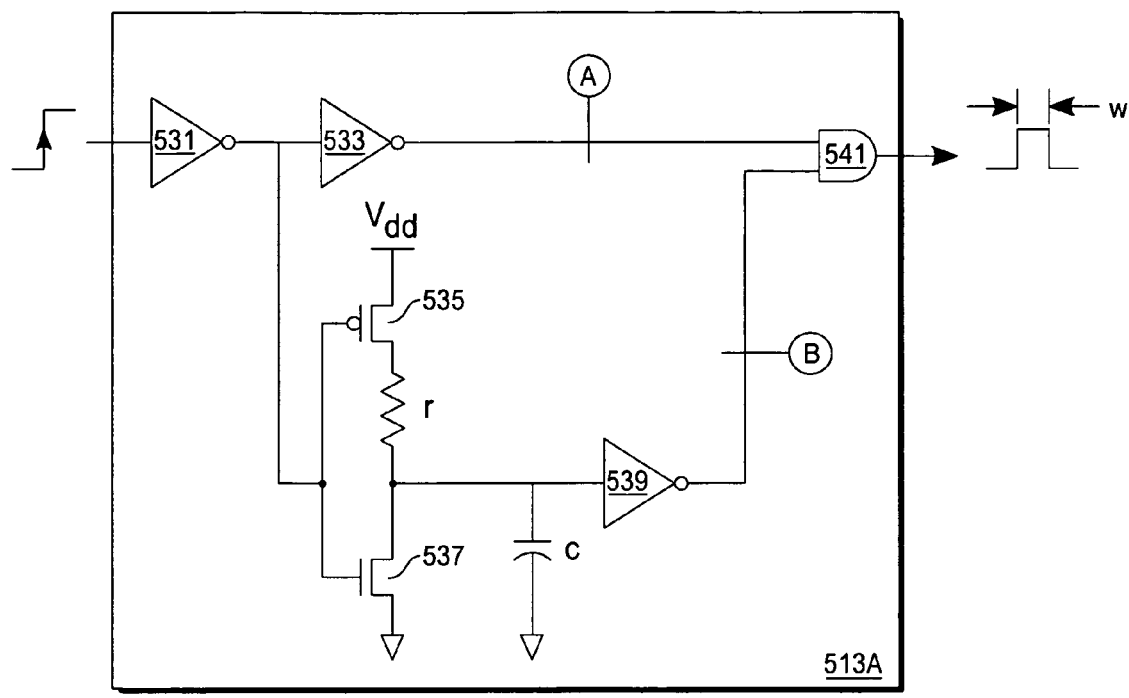
Fig._5C
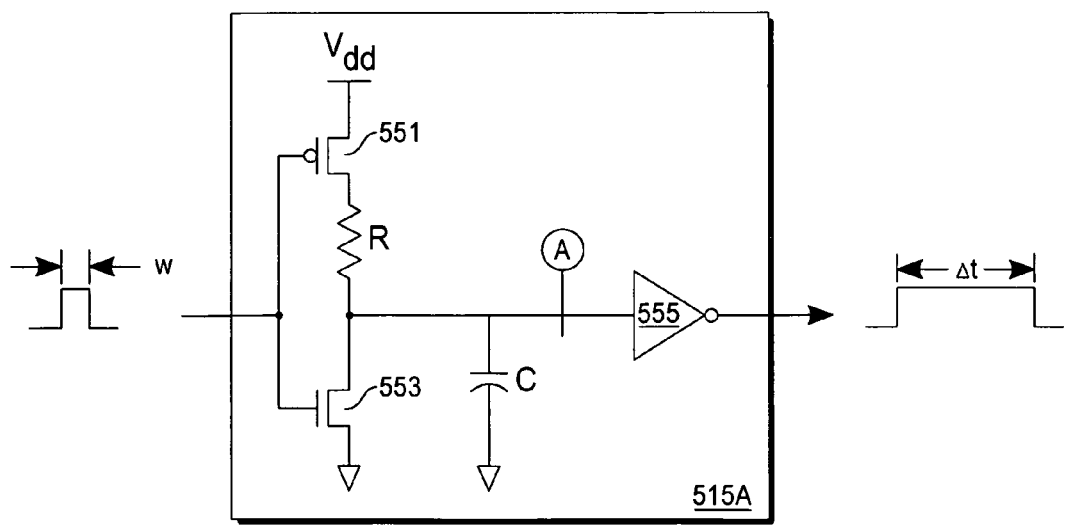
Fig._5D

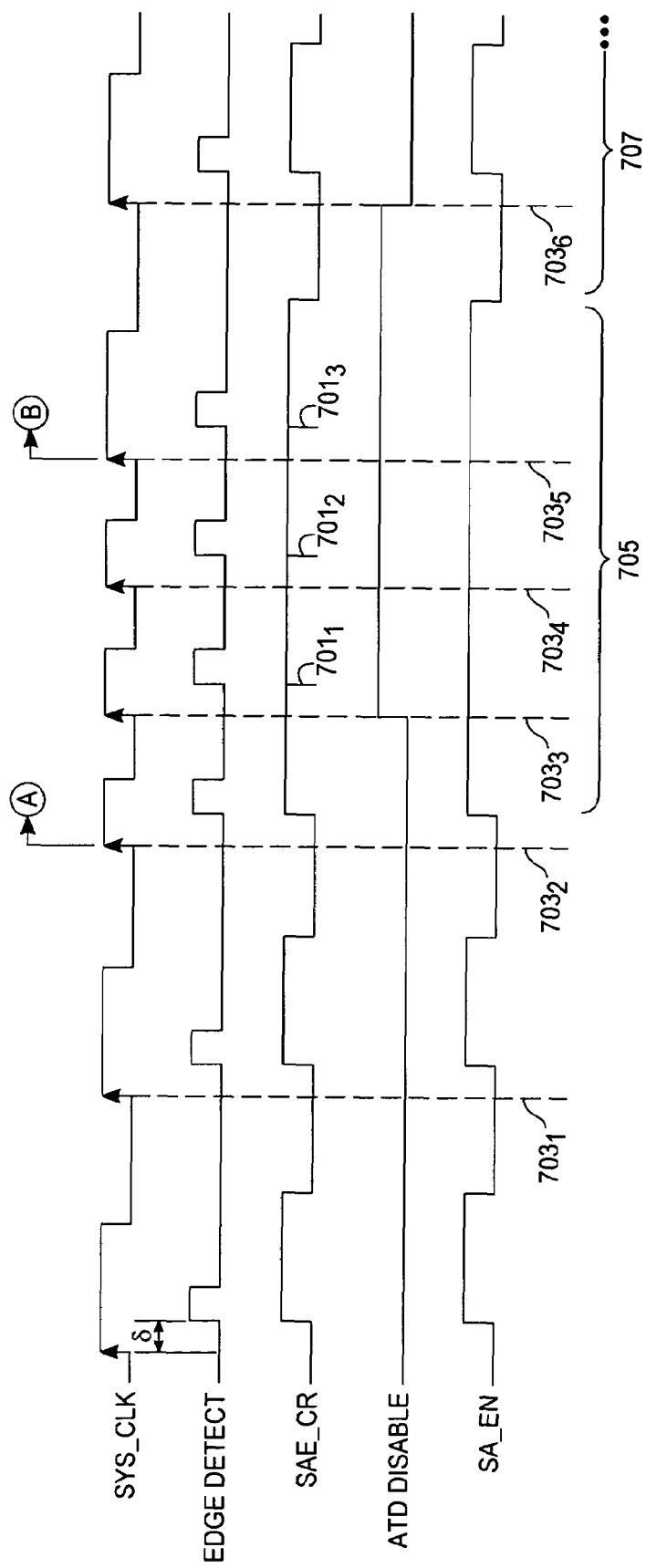
Fig._7

AUTOMATIC ADDRESS TRANSITION DETECTION (ATD) CONTROL FOR REDUCTION OF SENSE AMPLIFIER POWER CONSUMPTION

TECHNICAL FIELD

The present invention relates generally to operation of nonvolatile memory arrays and specifically to operations of nonvolatile memory arrays over a wide range of operating frequencies with low power consumption below a critical frequency.

BACKGROUND ART

Non-volatile memory devices, such as electrically erasable and programmable read only memories (EEPROMs), comprise core arrays of memory cells including a variable threshold transistor. Each memory cell can include a number of transistors; at least one of which will be a variable threshold (i.e., programmable) transistor.

With reference to FIG. 1, a portion 100 of a prior art memory array includes a plurality of memory cells 101; each of the plurality of memory cells 101 includes a pair of transistors, a select transistor 101A and a variable threshold transistor (i.e., a floating gate transistor) 101B. According to one version of the prior art, the select transistor 101A is an n-channel enhancement transistor, and the floating gate transistor 101B is an n-channel native transistor. Other kinds of the plurality of memory cells 101 each including a greater number of transistors are known in the prior art as well. Additionally, various arrangements of the plurality of memory cells 101 are known, such as NAND EEPROM and NOR EEPROM arrays.

The plurality of memory cells 101 is each interconnected by a plurality of wordlines lines 103, a plurality of sense lines 105, and a plurality of bitlines 107. In particular, drains of the each of the select transistors 101A are connected to one of the plurality of bitlines 107. A gate of each of the select transistors 101A and the floating gate transistors 101B is each connected to one of the plurality of wordlines 103 and sense lines 107 respectively.

In FIG. 2, a non-volatile memory arrangement 200 of the prior art includes a read select transistor 201, a read select line 201A, a sense amplifier 203, a data bus 203A, and a wordline decoder 205. The non-volatile memory arrangement further includes one each of the select transistors 101A and the floating gate transistors 101B from FIG. 1. As was the case in FIG. 1, according to an n-channel implementation of the select 101A and the floating gate 101B transistors, the drain of the select transistor 101A will be connected to one of the plurality of bitlines 107, and respective gates of the select 101A and the floating gate 101B transistors are connected respectively to one of the plurality of wordlines 103 and sense lines 105. The wordline 103 is driven by a word line decoder 205.

The read select transistor 201 is connected to the read select line 201A. When a read operation is active, the read select transistor 201 is turned on, thereby electrically connecting the bitline 107 to the data bus 203A. The data bus 203A, in turn, is connected to the sense amplifier 203. When the non-volatile memory arrangement 200 is subject to a read operation, a conductive state of the memory cell 101 is queried by connecting the bitline 107 to the sense amplifier 203 and applying appropriate bias voltages to the selected bitline 107, sense line 105, and wordline 103. If the select transistor 101A is turned on and the bias voltage applied to the sense line 105 exceeds a threshold of the floating gate transistor 101B, current will flow from the bitline 107 to ground through the memory cell 101 and the sense amplifier 203 will detect a "low" state. Conversely, if the bias voltage applied to the sense line 105 does not exceed the threshold of the floating gate transistor 101B, then no current will flow through the memory cell 101, and the sense amplifier 203 will detect a "high" state. While the sensing approach just described provides an operable memory arrangement, power consumption levels which characterize this approach are disadvantageous.

Power requirements of a contemporary memory sense amplifier are indicated in the dynamic power requirement, $P_{dyn}$, as a function of operating frequency, $f_{op}$, graph 300 of FIG. 3. A constant sense amplifier consumed power trace 301 is indicative of a minimum power requirement, per wordline, any time the sense amplifier 203 (FIG. 2) is in an operational mode. A minimum sense amplifier power, $P_{min}$, is determined by $$P_{min} = V_{dd} \cdot I_{SA}$$

where $V_{dd}$ is the system voltage and $I_{SA}$ is the sense amplifier current. A linear expression of total memory array power without sense amplifiers, $P_{array}$, 303 is governed by $$P_{array} = C_{core} \cdot V_{dd}^2 \cdot f_{op}$$

where $C_{core}$ is determined from a total gate-source capacitance, $C_{gs}$, value of each of the memory transistors within the plurality of memory cells 101 (FIG. 1). A total dynamic power requirement 305 is then determined by $$P_{dyn} = (C_{core} \cdot V_{dd}^2 \cdot f_{op}) + (V_{dd} \cdot I_{SA})$$

which is merely a summation of the constant amplifier consumed power 301 and the linear expression of total memory array power without sense amplifiers 303.

The dynamic power, $P_{dyn}$, is a function of one variable—operating frequency, $f_{op}$. Other functional dependencies, $C_{core}$, $V_{dd}$, and $I_{SA}$, are all fixed for a given memory array configuration. Therefore, it is desirable to minimize the total dynamic power requirement, especially in situations where either the operating frequency is variable during memory array operation or a given memory array is adaptable to a range of operating frequencies within a given circuit.

SUMMARY

An automatic address transition detection (ATD) circuit and method is described herein which allows a memory device to operate over a wide range of frequencies; the circuit and method provide for operation under reduced power consumption of the device if the device is operating in accordance with a low system clock frequency (less than, for example, 1 MHz). The reduction in power consumption derives from operating sense amplifiers within the memory device with a steady-state bias current only as compared with a higher-level of current needed for reading a state of memory cells. Therefore, in a system operating at a relatively low clock frequency, the higher-level of current is supplied to the sense amplifiers only at times when they are needed for reading memory cells.

The automatic ATD circuit operates, in one embodiment, with a first delay circuit configured to accept a system clock pulse as an input and produce a delayed version of the system clock pulse as an output. The delay to the system clock is performed to allow a frequency comparison in a later part of the circuit. A rising-edge detection circuit operates when the delayed system clock is received and senses a rising-edge of the delayed system clock pulse. A pulse output from the rising-edge detection circuit feeds into a second delay circuit; the second delay circuit produces an output pulse where a period of the pulse is determined by delay characteristics of the sense amplifier and is thus independent of system clock frequency. The pulse is compared to the system clock frequency. If the system clock frequency is above a determined frequency, the automatic ATD circuit is disabled. If the clock frequency is below the determined frequency, the automatic ATD circuit is enabled and provides a sense amplifier enable signal only when a memory cell read is required.

In an exemplary embodiment of a method of operating the automatic ATD circuit, steps involve delaying an input system clock signal by a first delay period; generating a first pulse (e.g., a rising-edge pulse) based on a the delayed input system clock signal; determining a second delay period based on delay characteristics of the sense amplifier (i.e., sense amplifier characteristics of a time to turn on, a charge delay time, and a time to turn off); producing a critical signal pulse based on the generated pulse and the determined second delay period; and comparing a first period of the system clock signal to the second delay period of the critical signal pulse. If a result of the comparison determines that the first period is shorter than the second period, an address transition detection (ATD) disable pulse is produced. If a result of the comparison determines that the first period is longer than the second period, an address transition detection (ATD) enable pulse is produced.

BRIEF DESCRIPTION OF THE DRAWINGS

FIG. 1 is a portion of a prior art non-volatile semiconductor memory core arrangement.

FIG. 2 is a prior art non-volatile semiconductor memory arrangement, which includes a conventional sense amplifier arrangement.

FIG. 3 is a graph indicating dynamic power requirement of a prior art conventional sense amplifier arrangement as a function of operating frequency.

FIG. 4 is a graph indicating dynamic power requirements of a sense amplifier arrangement in accordance with the present invention, also indicated as a function of operating frequency.

FIG. 5A is a block diagram of an exemplary embodiment of an automatic address transition detection (ATD) circuit in accord with the present invention as used in a memory circuit.

FIG. 5B is a block diagram of an exemplary embodiment of the automatic ATD circuit of FIG. 5A.

FIG. 5C is a schematic diagram of an exemplary embodiment of a pulse-edge detector circuit as employed in the automatic ATD circuit of FIG. 5B.

FIG. 5D is a schematic diagram of an exemplary embodiment of a sense amplifier critical pulse generator circuit as employed in the automatic ATD circuit of FIG. 5B.

FIG. 7 is an exemplary timing diagram of the automatic ATD circuit of FIG. 5A wherein a variable system clock frequency is employed.

DETAILED DESCRIPTION

Figure 5E:
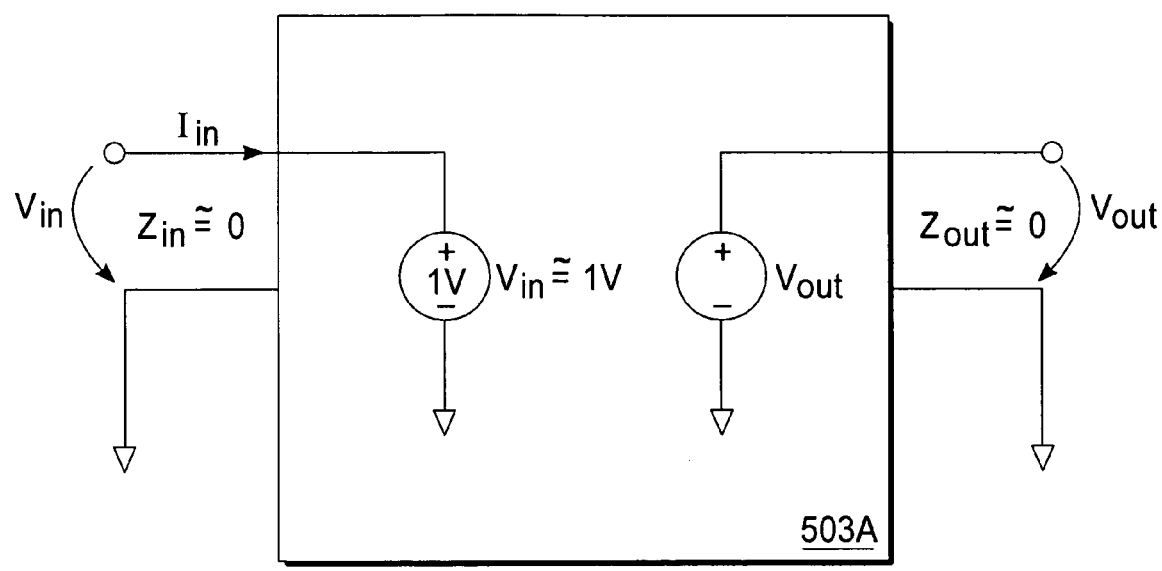
FIG. 5E is a schematic diagram of an exemplary embodiment of a transimpedance amplifier circuit as employed in the sense amplifier of FIG. 5A.

With reference to FIG. 4, power requirements of a memory sense amplifier in accordance with the present invention are indicated in the dynamic power requirement, $P_{dyn}$, as a function of operating frequency, $f_{op}$, graph 400. A constant sense amplifier consumed power trace 401 is indicative of a minimum power requirement any time a sense amplifier is in operational mode, i.e., constantly activated. In the present invention, the sense amplifiers are frequently operating in a residual-power mode, described infra. A residual-power mode, $P_{res}$, trace 403 is determined by $$P_{res} = m \cdot V_{dd} \cdot I_{SA,bias}$$

where m is an integer related to a total number of bits within a wordline. Therefore, typically m is set equal to 8, 16, or 32. A linear expression of total memory array power without sense amplifiers, $P_{array}$, 405 is governed by $$P_{array} = (C_{core} \cdot V_{dd}^2 \cdot f_{op}) + (m \cdot V_{dd} \cdot I_{SA,bias})$$

Unlike the prior art, the dynamic power requirement here has two sets of linear traces. A first trace 405 relates to a reduced dynamic power requirement for a memory array without full sense amplifier operation and a second trace 407 relates to a reduced dynamic power requirement for a memory array with full sense amplifier operation. Both the first 405 and the second trace 407 dynamic power requirement occur prior to a critical frequency, $f_{cr}$, 409. The critical frequency relates to a "slow mode" of memory cell operation and is inversely related to a critical access period, $T_{cr}$, such that $$f_{cr} = T_{cr}^{-1}$$

The critical access period term $T_{cr}$ will be developed shortly with reference to FIGS. 5B and 5D, infra. Dynamic power requirements are reduced at frequencies less than $f_{cr}$ due to a partial sense amplifier controlled power-down described in detail herein. At higher operational frequencies, that is, greater than $f_{cr}$, the present invention operates with a dynamic power requirement similar to the prior art. Thus, a first high frequency operation trace 411 and a second high frequency operation trace 413 are indicative of dynamic power requirements without and with sense amplifier operation, respectively.

Automatic Address Transition Detection (ATD) Circuit

With reference to FIG. 5A, an exemplary embodiment 500 of the present invention includes an automatic ATD circuit 501, a sense amplifier 503, a sense amplifier bias circuit 505, and a DQ flip-flop 507. The embodiment is interspersed with other portions of a memory array as will be recognized by one of skill in the art. The other portions of the memory array are shown merely to provide a schematic relationship of the present invention to a typical memory array.

Below a "critical frequency," $f_{cr}$, the automatic ATD circuit 501 senses whenever an address change occurs and provides a sense amplifier enable, SA_EN, signal to activate sense amplifiers within the memory array. A user can change a system clock frequency over a large range but a system-clock-independent SA_EN signal is determined by the automatic ATD circuit 501 without operator intervention. The automatic ATD circuit 501 senses when an address (ADDR) signal transitions and sends a signal for the sense amplifier to turn on, allowing for time periods sufficient for ramp-up of current to the sense amplifier and charging of the sense amplifier lines (i.e., the sense amplifier is activated during a valid data out period. The critical frequency, $f_{cr}$, is defined by particular characteristics within a given memory array circuit as explained in detail, infra. Above the critical frequency, the automatic ATD circuit 501 sends a constant SA_EN signal, allowing sense amplifiers to be constantly activated.

With reference to FIG. 5B an exemplary embodiment 501A of the automatic ATD circuit 501 of FIG. 5A includes a delay circuit 511, a rising-edge detection circuit 513, a critical period delay element 515, a first DQ flip-flop 517, an optional DQ flip-flop 519, and an OR gate 521.

A skilled artisan will recognize that the delay circuit 511 may be constructed in various ways. For example, an appropriate delay may be achieved by constructing an even number of inverters is series; the higher a number of inverters placed in series, the greater the delay. The initial time delay is chosen to allow a comparison of the SYS_CLK to an output of the critical period delay element 515, thus allowing any positive edge-triggered flip-flop to be used as a time comparator or phase detector. Therefore, if a signal input to the "D" input of the first DQ flip-flop 517 is "0" when the SYS_CLK goes high, then the system period is not short enough to disable SA_EN. Consequently, the automatic ATD detection circuit 501 remains in the "SLOW MODE" of operation (FIG. 4). Details of exemplary embodiments of the rising-edge detection circuit 513 and the critical period delay element 515 are given in FIGS. 5C and 5D, respectively. Determination of whether the optional DQ flip-flop 519 is included in the automatic ATD circuit 501A will depend upon a range of SYS_CLK frequencies to which the circuit is subjected and overall stability considerations (e.g., when a period of the SYS_CLK is close to the critical period, $T_{cr}$). Such stability considerations are determinable by a skilled artisan (e.g., by circuit simulation).

Operation of the exemplary automatic ATD circuit 501A is independent of a frequency of the system clock, SYS_CLK input. Instead, the exemplary automatic ATD circuit 501A simply relies on the frequency of the SYS_CLK signal to determine when to produce a sense amplifier enable, SA_EN, signal and a duration of the signal.

Timing diagrams of FIG. 5B indicate a SA_EN signal for two different SYS_CLK frequencies, $f_1$ and $f_2$. Recall that a period is simply an inverse of a clock frequency; thus $$f_1 = \frac{1}{T_1}$$

The automatic address transition detection circuit 501A compares frequencies of the SYS_CLK and an output of the critical period delay element 515. An SA_EN signal is therefore produced only if a negative edge of the SAE_CR pulse (i.e., an output of the critical period delay element 515) occurs before a subsequent rising-edge of the SYS_CLK. $T_{cr}$ is thus chosen to be longest period that will, overall, allow the sense amplifier 503 (FIG. 5A) to be on for the least amount of time possible, thereby saving power, but long enough in time to determine a memory cell state after an ATD signal occurs. Details of determination of the critical period, $T_{cr}$, and relationships between the ADDR and SA_EN are developed with reference to FIGS. 5D and 6, infra.

Operation of the Automatic ATD Circuit ($f_1 < f_{cr}$)

For a SYS_CLK frequency $f_1$, a value of $f_1$ is such that $T_1 > T_{cr}$. In this case, a SYS_CLK signal, shown at "A," is delayed, "B," by the delay circuit 511. A single pulse, at "C," is produced as an output of the rising-edge detection circuit 513. The single pulse at "C" is input to the critical period delay element 515. A resultant pulse from the critical period delay element, at "D," having a period $T_{cr}$, produces a SAE_CR pulse which is one of at least two signal inputs to the OR gate 521. (Details of the critical period delay element 515 are provided with reference to FIG. 5D, infra.) The SYS_CLK initiates the pulse train at "D" and also provides an enable signal to the first DQ flip-flop 517 (as well as the optional DQ flip-flop 519 if present) on a rising-edge 523 of the $f_1$ SYS_CLK signal. Since the resultant pulse from the critical period delay element, at "D," is low, a "0" is latched into the first DQ flip-flop 517. As long as a period of the SYS_CLK is greater than $T_{cr}$, (i.e., a frequency of the SYS_CLK is less than the critical frequency, $f_{cr}$ (FIG. 4)), then an SA_EN signal will only be produced when an address transition detection (ATD) occurs.

Operation of the Automatic ATD Circuit ($f_2 > f_{cr}$)

For a SYS_CLK frequency $f_2$, a value of $f_2$ is such that its related period $T_2 < T_{cr}$. In this case, a high frequency SYS_CLK signal, at "A," is again delayed, shown at "B," by the delay circuit 511. As shown at "C," a single pulse is produced as an output of the rising-edge detection circuit 513. The single pulse at "C" is input to the critical period delay element 515. The resultant pulse (i.e., the same pulse as describe supra with respect to the SYS_CLK frequency at $f_1$) from the critical period delay element, at "D," having period $T_{cr}$, produces a SAE_CR pulse which is input to the OR gate 521. The SYS_CLK still initiates the pulse train at "D" and also provides an enable signal to the first DQ flip-flop 517 (and the optional DQ flip-flop 519) on a rising-edge 525 of the $f_2$ SYS_CLK signal. Here however, since the resultant pulse from the critical period delay element, at "D," is high, a "1" is latched into the first DQ flip-flop 517. Consequently an SA_EN signal appears high at an output of the OR gate 521.

Operation of the Rising-Edge Detection Circuit

With reference to FIG. 5C, an exemplary embodiment of a rising-edge detection circuit 513A includes a first inverter 531, a second inverter 533, a PMOS transistor 535, an NMOS transistor 537, a third inverter 539, and a AND gate 541. Additionally included are analog components; a resistor having a value "r" and a capacitor having a value "c." The rising-edge detection circuit 513A is thus a hybrid analog-digital circuit. A combination of the PMOS transistor 535 and the NMOS transistor 537 essentially act as an inverter element. However, a combined effect of the resistor and capacitor produce a time constant, $\tau$, such that a minimum time delay value, $\partial_{min}$, is the product of the resistive and capacitive values multiplied by the natural log value of "2." Thus $$\partial_{min} = rc \cdot [\ln(2)]$$

where $\partial_{min}$ neglects minimal effects of digital component propagation delays. Consequently, any signal through the lower inverter leg portion of the rising-edge detection circuit 513A will be further delayed in comparison to the signal traveling through the upper leg due to the lower leg analog components. For example, assuming a rising-edge appears at an input to the rising-edge detection circuit 513A, a "fast 1" is produced at point "A." After the first inverter 531, a resulting "0" makes its way to the bottom leg, causing the PMOS transistor 535 to act as a pull-up device, creating a "1" as an input to the third inverter 539. However, due to the delay going through the resistive and capacitive analog components, the signal is delayed by $\partial_{min}$ prior to passing through the third inverter 539. At point "B," a "slow 0" (or, otherwise put, a lingering "one") is present due to the analog delay. Thus, a signal output from the AND gate 541 produces a narrow pulse only at times when both the top leg and bottom leg each are producing a high signal. A width, w, appropriate as an input to the critical period delay element 515 (FIG. 5B), may thus be chosen through proper selection of the resistive and capacitive elements.

Operation of the Critical Period Delay Element

Figure 6:
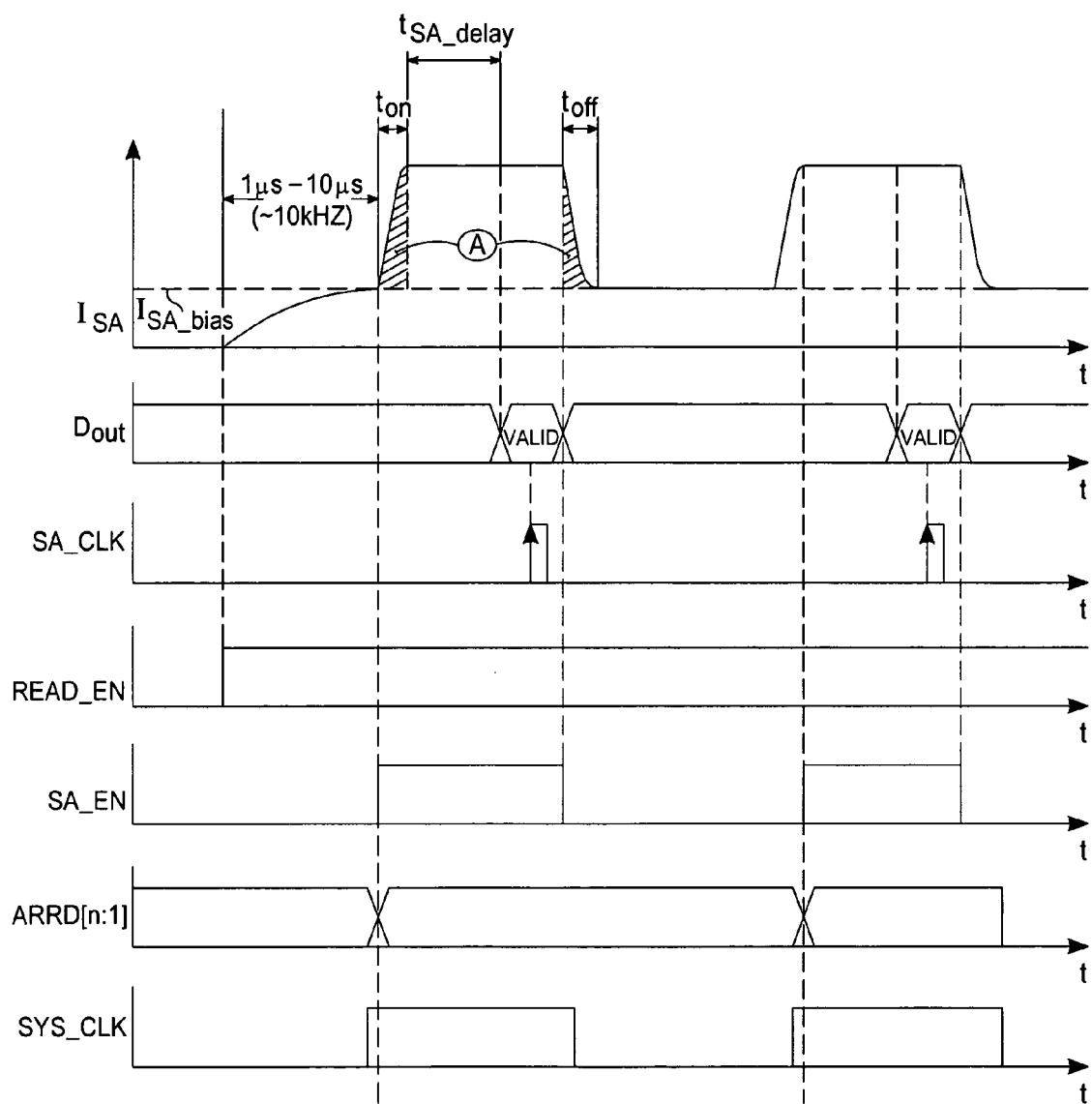
FIG. 6 is an exemplary timing diagram of the automatic ATD circuit of FIG. 5A.

With reference to FIG. 5D, an exemplary embodiment of a critical period delay element 515A produces an output pulse having a width Δt based on the input pulse trigger from the rising-edge detection circuit 513. A critical period, $T_c$, is determined (for example, by circuit simulation) such that $$T_C = t_{on} + t_{SA\_delay} + t_{off}$$

where $t_{on}$, $t_{SA\_delay}$, and $t_{off}$ will be defined with reference to FIG. 6, infra. The critical period delay element 515A includes a PMOS transistor 551, an NMOS transistor 553, a resistor, a capacitor, and an inverter 555. The critical period delay element 515A functions similarly to the lower leg of the rising-edge detection circuit 513A. Here, Δt=RC·[ln(2)], where "R" and "C" are resistive and capacitive values respectively that are chosen to give a pulse width Δt equal to the critical period, $T_C$. The minimum width, w, of the input pulse output from the rising-edge detection circuit 513A (FIG. 5C) is chosen to be long enough to fully discharge the capacitor. For this application, a value of the input pulse width, w, is typically less than 5 nanoseconds with an exemplary value of 3 nanoseconds minimizing total circuit delays. A trip point voltage, $V_{tp}$, at point "A" sufficient to cause the inverter 555 to change states is simply $$V_{tp} = \frac{V_{dd}}{2}$$

where $V_{dd}$ is the system supply voltage.

Sense Amplifier Design

With reference to FIG. 5E, an exemplary sense amplifier 503A is based on a transimpedance amplifier design, described in detail in U.S. Pat. No. 5,493,533, to Emil Lambrache (the inventor of the present invention described herein). U.S. Pat. No. 5,493,533 is hereby incorporated by reference in its entirety.

In brief, the sense amplifier 503A is designed such that an output voltage, $V_{out}$, is a function of a transimpedance transfer function, $Z_f$, input current, $I_{in}$, a reference current, $I_{ref}$, and the supply voltage, $V_{dd}$, according to the formula $$V_{out} = Z_f(-I_{in} + I_{ref}) + \frac{V_{dd}}{2}$$

and $V_{out}$ is a digital output voltage based on analog current inputs where $I_{in} = I_{cell}$ when reading a programmed memory cell such that $$V_{out} = \begin{cases} 0; & \text{for } I_{in} \geq I_{ref} \text{ when } I_{in} = I_{cell} \\ V_{dd}; & \text{for } I_{in} \geq I_{ref} \text{ when } I_{in} = 0 \text{(erased cell)} \end{cases}$$

Further design considerations include determining a transimpedance transfer function, $Z_f$, such that $$Z_{ref} \cdot I_{ref} = \frac{V_{dd}}{2}$$

and determining a reference current $I_{ref}$ such that $$I_{ref} = \frac{I_{cell}}{2},$$

where $I_{cell} \cong 10$ μA for a typical programmed memory cell.

Representative Timing Diagrams

With reference to FIG. 6, an exemplary timing diagram of the automatic ATD circuit of FIG. 5A has a sense amplifier current graph, $I_{SA}$ that begins to ramp up to a steady sense amplifier bias current, $I_{SA\_bias}$, as soon as a read enable, READ_EN, signal is asserted. Depending upon characteristics of the sense amplifier circuit, the sense amplifier bias current achieves a steady-state condition typically within 1 μs–10 μs. An address transition signal, ADDR[n:1], may be asserted after the SYS_CLK goes high. Upon detection of an ADDR[n:1] signal, the automatic ATD control circuit 501 (FIG. 5A) sends an SA_EN signal to the sense amplifier 503, causing charge to be pumped into the sense amplifier (i.e., charge capacitor gate-to-source, $C_{g-s}$ to pump an electron charge into a channel of the transistor). A time delay, $t_{on}$, occurs while the sense amplifier is being charged. There is an additional delay, $t_{SA\_delay}$, that occurs while sense amplifier lines to the memory cell are charging. After the lines are fully charged, an SA_CLK signal is asserted, allowing a data output, $D_{out}$, to be latched into the DQ flip-flop 507 (FIG. 5A). $D_{out}$ will be valid until the SA_EN signal goes low, forcing the sense amplifier current to return to an $I_{SA\_bias}$ condition after a slight delay period, $t_{off}$, where charge is bled off. Thus, a significant power savings may be realized by employing the automatic ATD control circuit. For example, if a low speed SYS_CLK operation has a frequency of 1 MHz and an SA_EN signal of 100 nsec is sufficient to enable data from a memory cell, then only $$\frac{100 \ nsec}{1 \ \mu sec} = 10\%$$

of the power required to keep a sense amplifier at full power constantly is utilized by adoption of the present invention. Therefore, the critical time period, $T_c$, noted above with regard to FIG. 5D (recall that $T_c = t_{on} + t_{SA\_delay} + t_{off}$) is calculated based on the delay times referenced in the $I_{SA}$ graph.

Note further that as the SYS_CLK frequency increases to a frequency slightly greater than $t_{SA\_delay}$, there is no advantage in turning the sense amplifier off as an inherent charge wasted (indicated by an integration of the hatched areas "A" representing charge pumped in during $t_{on}$ and charge bled off during $t_{off}$) is greater than any possible energy savings. However, the SYS_CLK frequency may be constantly changed and the automatic ATD control circuit 501 will determine an optimal timing determination for turning the sense amplifier on or off or leaving the sense amplifier on constantly. This automatic determination feature is exemplified with reference to FIGS. 5B and 7.

FIG. 7 indicates a SYS_CLK at a first frequency until point "A" whereupon the SYS_CLK switches to a second frequency. At point "B" the SYS_CLK changes to a third frequency (or back to the first frequency). An EDGE DETECT graph indicates an output from the rising-edge detection circuit 513 (point "C" in FIG. 5B). Note that both a width of the edge detect pulse and an SAE_CR signal are constant despite a change in the SYS_CLK frequency. For example, note that at a rising-edge of the SYS_CLK at a first rising-edge time $703_1$, an output of the critical period delay element 515 (point "D" in FIG. 5B) goes high and returns to "0" prior to the next rising-edge of the SYS_CLK pulse at a second rising-edge time $703_2$. Thus the circuit is operating in a low power operation mode, keeping the sense amplifier in a low power mode (i.e., "SLOW MODE," FIG. 4) by supplying operational current to the sense amplifier only as long as needed. However, at point "B" where the SYS_CLK frequency changes to a frequency greater than the critical frequency, $f_{cr}$, (FIG. 4) such that the SAE_CR pulse is unable to return to "0" prior to a subsequent rising clock edge of the SYS_CLK at a third rising-edge time $703_3$. Thus, the output of the first flip-flop 517 which is an ATD_DISABLE signal is asserted at the third rising-edge time $703_3$ and remains high during a period of high frequency operation 705 continuing through subsequent rising-edge times $703_4$, $703_5$. The optional DQ flip-flop 519 creates a second ATD_DISABLE signal in case the first one has a glitch when f is approximately equal to $f_{cr}$ and the first DQ flip-flop 517 is left in a metastable state. During the second low frequency operation period 707, the automatic ATD control circuit 501 restarts the low power operation mode beginning at a fourth rising-edge time $703_6$.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that the DQ flip-flops of FIG. 5B may be substituted with other components to achieve a similar time comparison function. For example, a Schmitt trigger could be used in place of the optional DQ flip-flop 519 of FIG. 5B. Further, other circuits may be substituted for the rising-edge detection circuit 513A and the critical period delay element 515A of FIGS. 5C and 5D respectively. Further, the rising-edge detection circuit may be reconfigured, with appropriate timing considerations, to operate on a falling-edge of the clock. The resistors and capacitors described herein may similarly be substituted by appropriate resistive and capacitive elements as known in the art. The specification and drawings are, accordingly, to be regarded in an illustrative rather than a restrictive sense.

What is claimed is:

1. An automatic address transition detection circuit, comprising:
    a first delay circuit element configured to accept a system clock pulse as an input and produce a delayed version of the system clock pulse as an output, the system clock having a first time period;
    a pulse-edge detection circuit element coupled to the first delay circuit element and configured to sense an edge of the delayed system clock pulse;
    a second delay circuit element having an input coupled to the pulse-edge detection circuit element and an output coupled to an enable terminal of a sense amplifier, the second delay circuit element being configured to produce an output pulse, the output pulse having a second time period, the second time period being determined by delay characteristics of the sense amplifier.

2. The automatic address transition detection circuit of claim 1 wherein the pulse-edge detection circuit element is operable upon application of a rising-edge of the system clock pulse.

3. The automatic address transition detection circuit of claim 1 wherein delay characteristics of the sense amplifier include a time-on delay, a sense amplifier charge delay, and a time-off delay.

4. The automatic address transition detection circuit of claim 1 further including at least one latch and an OR gate, wherein an input of the at least one latch is coupled to the output of the second delay circuit element and an output of the at least one latch is coupled to an input of the OR gate.

5. The automatic address transition detection circuit of claim 4 wherein the at least one latch is a DQ-type flip-flop.

6. The automatic address transition detection circuit of claim 1 wherein the pulse-edge detection circuit element comprises:
    a first circuit leg having a first inverter and a second inverter, the first inverter and the second inverter being coupled in series, the first circuit leg further being coupled to a first input of an AND gate;
    a second circuit leg coupled in parallel with the first circuit leg, the second circuit leg of the pulse-edge detection circuit element having a modified inverter and a third inverter coupled in series with each other, an output of the third inverter being coupled to a second input of the AND gate, an input of the modified inverter being coupled to an output of the first inverter, the modified inverter having a PMOS transistor and an NMOS transistor coupled in series with each other with a resistive element coupled in series between the PMOS transistor and the NMOS transistor, the second circuit leg further having a capacitive element, the capacitive element being coupled in parallel with the NMOS transistor.

7. The automatic address transition detection circuit of claim 6 wherein values of the resistive element and the capacitive element are chosen to produce a time constant, the time constant being long enough to discharge a capacitive element of the second delay circuit element.

8. The automatic address transition detection circuit of claim 1 wherein the second delay circuit element comprises:
    a first inverter, a modified inverter, and a capacitive element, the first inverter and the modified inverter being coupled in series with each other, the modified inverter having a PMOS transistor and an NMOS transistor coupled in series with each other with a resistive element coupled in series between the PMOS transistor and the NMOS transistor, the capacitive element being coupled in parallel with the NMOS transistor.

9. The automatic address transition detection circuit of claim 8 wherein values of the resistive element and the capacitive element are chosen to produce a time constant, the time constant being long enough to produce a delay approximately equal to the delay characteristics of the sense amplifier, the delay characteristics including a time-on delay, a sense amplifier charge delay, and a time-off delay.

10. An automatic address transition detection circuit, comprising:
a first delay means for accepting a system clock pulse as an input and producing a delayed version of the system clock pulse as an output, the system clock having a first time period;
a pulse-edge detection means for sensing an edge of the delayed system clock pulse;
a second delay means for producing an output pulse, the output pulse having a second time period, the second time period being determined by delay characteristics of a sense amplifier.

11. The automatic address transition detection circuit of claim 10 wherein the pulse-edge detection means is operable based upon an application of a rising-edge of the system clock pulse.

12. The automatic address transition detection circuit of claim 10 wherein delay characteristics of the sense amplifier include a time-on delay, a sense amplifier charge delay, and a time-off delay.

13. The automatic address transition detection circuit of claim 10 further including:
at least one latching means for comparing the first time period with the second time period; and
an OR gate, wherein the at least one latching means receives an output signal from the second delay circuit and produces an input signal for the OR gate.

14. An automatic address transition detection circuit, comprising:
a first delay circuit element configured to accept a system clock pulse as an input and produce a delayed version of the system clock pulse as an output, the system clock having a first time period;
a rising-edge detection circuit element coupled to the first delay circuit element and configured to sense a rising-edge of the delayed system clock pulse;
a second delay circuit element having an input coupled to the rising-edge detection circuit and an output coupled to an enable terminal of a sense amplifier, the second delay circuit element being configured to produce an output pulse, the output pulse having a second time period, the second time period being determined by delay characteristics of the sense amplifier;
at least one latch, an input of the at least one latch being coupled to the output of the second delay circuit element; and
an OR gate, an input of the OR gate being coupled to an output of the at least one latch.

15. The automatic address transition detection circuit of claim 14 wherein delay characteristics of the sense amplifier include a time-on delay, a sense amplifier charge delay, and a time-off delay.

16. The automatic address transition detection circuit of claim 14 wherein the pulse-edge detection circuit comprises:
a first circuit leg having a first inverter and a second inverter, the first inverter and the second inverter being coupled in series, the first circuit leg further being coupled to a first input of an AND gate;
a second circuit leg coupled in parallel with the first circuit leg, the second circuit leg of the pulse-edge detection circuit element having a modified inverter and a third inverter coupled in series with each other, an output of the third inverter being coupled to a second input of the AND gate, an input of the modified inverter being coupled to an output of the first inverter, the modified inverter having a PMOS transistor and an NMOS transistor coupled in series with each other with a resistive element coupled in series between the PMOS transistor and the NMOS transistor, the second circuit leg further having a capacitive element, the capacitive element being coupled in parallel with the NMOS transistor.

17. The automatic address transition detection circuit of claim 16 wherein values of the resistive element and the capacitive element are chosen to produce a time constant, the time constant being long enough to discharge a capacitive element of the second delay circuit.

18. The automatic address transition detection circuit of claim 14 wherein the second delay circuit element comprises:
a first inverter, a modified inverter, and a capacitive element, the first inverter and the modified inverter being coupled in series with each other, the modified inverter having a PMOS transistor and an NMOS transistor coupled in series with each other with a resistive element coupled in series between the PMOS transistor and the NMOS transistor, the capacitive element being coupled in parallel with the NMOS transistor.

19. The automatic address transition detection circuit of claim 18 wherein values of the resistive element and the capacitive element are chosen to produce a time constant, the time constant being long enough to produce a delay approximately equal to the delay characteristics of the sense amplifier, the delay characteristics including a time-on delay, a sense amplifier charge delay, and a time-off delay.

20. A method of operating a sense amplifier, the method comprising:
delaying an input system clock signal by a first delay period;
generating a first pulse based on the delayed input system clock signal;
determining a second delay period based on delay characteristics of the sense amplifier;
producing a critical signal pulse based on the generated pulse and the determined second delay period;
comparing a first period of the system clock signal to the second delay period of the critical signal pulse; and
producing an address transition detection (ATD) disable pulse if a result of the comparison determines that the first period is shorter than the second period.

21. The method of claim 20 further comprising producing an address transition detection (ATD) enable pulse if the result of the comparison determines that the first period is longer than the second period.

22. The method of claim 20 further comprising:
detecting whether an address transition detection (ATD) pulse is present; and
generating a sense amplifier enable pulse if an ATD pulse is present.

23. The method of claim 20 wherein the generated first pulse is based on a rising-edge of the delayed input system clock signal.

24. The method of claim 20 wherein the step of determining a second delay period includes summing a time-on period delay, a sense amplifier charging period delay, and a time-off period delay of the sense amplifier.

* * * * *